United States Patent [19]

Freeouf et al.

[11] Patent Number: 4,597,825
[45] Date of Patent: Jul. 1, 1986

[54] INTERMEDIATE PASSIVATION AND CLEANING OF COMPOUND SEMICONDUCTOR SURFACES

[75] Inventors: John L. Freeouf, Peekskill; Thomas N. Jackson, Ossining, both of N.Y.; Peter Oelhafen, Basel, Switzerland; George D. Pettit, Mahopac; Jerry M. Woodall, Bedford Hills, both of N.Y.

[73] Assignee: International Business Machines Corporation, Armonk, N.Y.

[21] Appl. No.: 718,987

[22] Filed: Apr. 2, 1985

Related U.S. Application Data

[62] Division of Ser. No. 440,654, Nov. 10, 1982.

[51] Int. Cl.$^4$ .................. H01L 21/306; B44C 1/22; C03C 15/00; C03C 25/06
[52] U.S. Cl. ................................. 156/643; 156/655; 156/662; 252/79.2; 250/492.2
[58] Field of Search .............. 134/1, 3; 250/492.2, 250/492.3; 148/1.5, 175, 33.3; 29/576 E; 156/643, 655, 662; 252/79.2

[56] References Cited

U.S. PATENT DOCUMENTS

4,351,706 9/1982 Chappell et al. ............... 204/129.3

OTHER PUBLICATIONS

J. Vac. Sci. Technol., 19(2), Jul./Aug. 1981, Protection of Molecular Beam Epitaxy Grown $Al_xGa_{1-x}$ As Epilayers During Ambient Transfer by S. P. Kowalczyk et al., pp. 255-256.
J. Vac. Sci. Technol., 21(2), Jul./Aug. 1982, Peroxide Etch Chemistry on <100> I No. 53 (Ga 0.47 As by D. E. Aspnes et al., pp. 413-416.

Primary Examiner—William A. Powell
Attorney, Agent, or Firm—Alvin J. Riddles

[57] ABSTRACT

Crystalline compound semiconductors are passivated with a layer of the most volatile element thereof to prevent the formation of oxides that would interfere with further processing. A GaAs crystal is provided with a surface layer of arsenic. The arsenic layer is formed by exposure to light having a photon energy greater than 1.8 eV, at a power density of 0.01 to 0.5 watts per cm$^2$ while the GaAs immersed in a 1:1 $HCl:H_2O$ solution for a period of 10-30 minutes. The intermediate processing passivated GaAs crystal may be stored and handled in air and the As layer is removed by low temperature baking.

6 Claims, 2 Drawing Figures

INTERMEDIATE PASSIVATION AND CLEANING OF COMPOUND SEMICONDUCTOR SURFACES

This is a divisional application of Ser. No. 440,654, filed Nov. 10, 1982.

DESCRIPTION

1. Technical Field

The technical field of the invention is the use of compound semiconductors and their alloys for semiconductor device purposes. Crystalline multielement compound semiconductor materials have a number of advantages but such materials require special care in fabrication operations. One major limitation is that oxides which form on the surface of the compound semiconductor crystals which receive further processing, require removal prior to some types of subsequent processing operations. Since the material involves more than one element, more than one oxide can form, with some oxides being harder to remove than others. Thus, processing difficulties are encountered which may require special steps or high temperatures which frequently are incompatible with other processing operations.

2. Background Art

Prior procedures for generating clean and atomically ordered surfaces of compound semiconductors and their alloys that have already been air exposed, for example, Gallium Arsenide (GaAs) and Gallium Aluminum Arsenide (GaAlAs), include thermal annealing, normal and high temperature ion bombardment and annealing (IBA). In addition, as reported in J. Vac. Sci. Tech. 19 (2), August 1981, pages 255 and 256, already clean surfaces of GaAs, GaAlAs epitaxial layers that have been formed in ultrahigh vacuum (UHV) conditions by the molecular beam epitaxy (MBE) method have been protected by coating with As prior to removal from the UHV conditions into air.

For air exposed type surfaces, the prior art procedures provide clean surfaces for further processing but they require a removal step which generally involves temperatures which are so high as to introduce other problems such as the diffusion of impurities from precise locations or out of the substrate or prevent patterning for device circuitry.

It is an object of this invention to provide an air exposable semiconductor surface with a passivation layer which is easily removed using non-detrimental steps and low temperatures and providing an oxide free, clean and well ordered surface, capable of localized processing.

DISCLOSURE OF THE INVENTION

The invention involves a semiconductor product of a multielement compound crystalline semiconductor having a surface layer of the most volatile element thereof for use intermediate in the series of processing steps. The invention usually involves at least a layer of a crystalline wafer with at least one surface on which devices are to be positioned that can be handled in air and then readily processed for such operations as further epitaxial layers by removal of any oxide on the most volatile element layer by low temperature baking which removes the most volatile element layer and oxides thereof.

In order to facilitate explanation, the description of the invention will be set forth in terms of a particular semiconductor and volatile element thereof; however, it will be apparent to one skilled in the art in the light of the principles set forth that the teaching may be readily translated to other semiconductor materials and elements such as Indium Arsenide (InAs), Gallium Indium Arsenide (GaInAs) and Gallium Aluminum Arsenide (GaAlAs).

For the material Gallium Arsenide (GaAs), the necessary thickness of the most volatile element As layer will be governed by the harshness of the environmental conditions until the further processing takes place. Under normal temperature and corrosiveness conditions, such as room temperature in air, an arsenic layer of 10 to 500Å is satisfactory. Where the semiconductor intermediate product is GaAs, it may be formed by the exposure of, on at least the future processing surface, a crystalline GaAs member to light with a photon energy of greater than 1.8 eV at a power density of 0.01 to 0.5 W/cm$^2$, while the GaAs is immersed in a 1:1 HCl:H$_2$O mixture or other solutions which do not etch the more volatile element for a period of 10–30 minutes.

Figure 1:
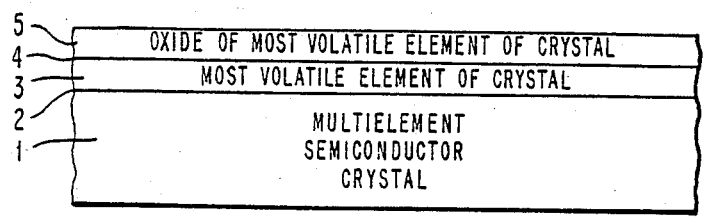
FIG. 1 is the passivated semiconductor of the invention.

The resulting structure is schematically illustrated in FIG. 1 wherein the upper surface is illustrative of the surface on which future processing is to occur.

Figure 2:
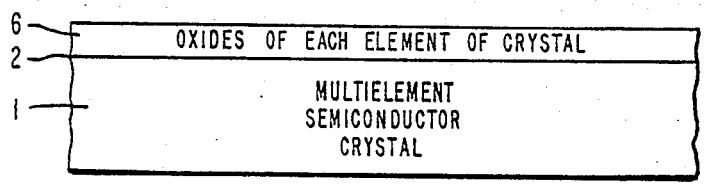
FIG. 2 is a prior art semiconductor.

The invention as illustrated in FIG. 1 is contrasted with the prior art as shown in FIG. 2 in that the layer 6 involves oxides of each element of the multielement semiconductor.

Referring to FIG. 1, a GaAs crystalline member 1, such as a wafer, is provided on the future processing surface 2 with a layer of arsenic 3. In FIG. 1 an oxide layer 5 is shown on the upper surface 4 of the layer 3. When the wafer is handled in air, a layer 5 of arsenic oxide forms. The layer 5 may be formed by exposing the layer 3 to an oxidizing environment.

The structure of FIG. 1 is an intermediate semiconductor product which permits a wafer of GaAs to be stored on the shelf in relaxed environmental constraints and at the time of use the layers 5 and 3 can be readily and predictably removed involving low temperature steps by merely baking at temperatures of the order of 150°–500° C. The problem solved by the invention has been a limitation to the fabrication of devices in the art especially where the devices are formed in an epitaxial layer grown on the surface of a substrate wafer. In order to form epitaxial layers of GaAs, GaAlAs, etc., on GaAs substrate wafers, in order for the layers to have good optical and electrical qualities and to have epitaxial layer substrate interfaces which have low defect densities, the GaAs substrate surface must be free of any native oxides yet must be fully crystalline in structure at the surface with minimum defects. However, annealing GaAs at the temperatures necessary to remove the oxides and especially the non-volatile element oxides will result in an accumulation of defects and unwanted impurities at the surfaces. Therefore, there are limits to the ability to remove oxides.

Where the method of liquid phase epitaxial growth is employed, the substrate wafer is generally baked in hydrogen at temperatures greater than 650° C., then the GaAs substrate wafer surface is placed in contact with an undersaturated liquid phase melt which first dissolves some of the surface and then with a temperature drop there is epitaxial growth.

In the case of the technique of chemical vapor deposition, CVD, the GaAs substrate is generally etched in HCL acid vapor, at greater than 600° C. prior to the CVD growth. In the case of the molecular beam epitaxy (MBE) technique it is normally required to anneal the substrate at temperatures above 550° C. to remove the oxide and to produce an atomically ordered surface prior to epitaxial growth.

In each technique, temperatures in excess of 550° C. and as high as 640° C. are required for assurance that the surface of the GaAs substrate will be free of any oxide inclusions and will be adequate for high yield semiconductor devices. This requirement is quite rigorous because in a broad array a single one micron region of oxide in a large series circuit can render the entire circuit inoperative.

In accordance with the invention, the arsenic layer 3 is the higher volatility element and the oxide thereof is layer 5 both of which come off easily at low temperature. Further, the arsenic prevents the formation of all other less volatile oxides such as gallium oxide which does not come off easily or entirely until the temperature is raised to undesirable levels such as 550° C., which is detrimental to the product being produced.

In accordance with the invention by photoetching the GaAs 1 surface 2 under controlled conditions, a continuous film of arsenic 3 is formed on the GaAs which does not dissolve easily. The arsenic layer 3 at surface 4 then in turn partially oxidizes in air or can be oxidized to form an arsenic oxide layer 5.

BEST MODE FOR CARRYING OUT THE INVENTION

In accordance with the invention, a crystalline substrate wafer of n-type GaAs having a [100] crystallographic orientation is prepared using standard chemical cleaning procedures such as an etch in 7:1:1 $H_2SO_4$:$H_2O_2$:$H_2O$ and thereafter a rinse in deionized water.

The n-type GaAs wafer is then placed in a 1:1 HCl water solution for a period of about 10–30 minutes. During that time, the wafer is irradiated with a 0.01 to 0.5 watt/cm$^2$ light having a photon energy in excess of 1.8 eV. The 1.8 eV level is higher than the bandgap of GaAs.

During that time the photoetch products including the gallium species are dissolved in the solution leaving a GaAs wafer 1 with a layer of arsenic 3 10 to 200Å thick over the surface 2 and upon exposure to air, a further layer of arsenic oxide will form on the surface 4 of the arsenic 3.

The substrate wafer may then be handled and stored in air.

When it is subsequently desired to conduct further epitaxial growth or other processing, the wafer is annealed at 150° C. to 500° C. In the annealing, at 150° C. most of the surface layer 3 of arsenic will desorb, and all will be gone at 300° C. Temperatures above 300° C. up to the 500° C. level may be used for metallization operations such as alloying.

The wafer is generally n-conductivity type doped with Si although one skilled in the art may make substitutions for different conductivity types.

An arsenic layer may be generated on a semi-insulating GaAs surface by photoetching while maintaining the GaAs in an anodic bias condition. On the other hand, p-type samples require a bias to produce a hole current while photoetching. Under certain conditions, an anodic bias alone will be sufficient to produce the layer of the most volatile element As.

The properties of the characteristics of the layer 3 have been determined through the use of standard surface science tools and the data for a number of samples is shown in Table 1.

TABLE 1

| SURFACE | TREATMENT | ESCA Ga/As | ESCA O/GaAs | LEED PATTERN |
|---|---|---|---|---|
| (100) | Air Exposed | 0.63 | 0.63 | none |
| (100) | Photo Etched (PE) | 0.36 | 0.24 | none |
|  | 350° C. | 0.72 | 0.13 | yes |
| (100) | PE | 0.39 | 0.17 | none |
|  | 350° C. | 0.73 | 0.11 | yes |
| (100) | PE | 0.27 | 0.37 | — |
|  | 300° C. | 0.63 | 0.18 | yes |
| (100) | PE | 0.28 | 0.03 | — |
| (100) | PE | 0.07 | 0.13 | — |
| (100) | PE | 0.06 | 0.12 | — |
|  | 150 eV/145° C. | 0.18 | 0.03 | yes |
|  | 290° C. | 0.63 | 0.04 | — |
| (100) | PE | 0.51 | 0.33 | — |
|  | 200 eV/160° C. | 0.71 | 0.02 | yes |

The data in Table 1 is provided involving the standard in the art test techniques of "Electron Spectroscopy for Chemical Analysis" (ESCA) and "Low Energy Electron Diffraction" (LEED).

The data in Table 1 illustrates that for an air exposed [100] surface the GaAs surface is stoichiometric with respect to gallium and arsenic (Ga/As=0.63), and that the surface contains a relatively large amount of oxide (O/GaAs=0.63) and is disordered (no LEED pattern). The photoetched surface has a relatively large As concentration (Ga/As=0.06 to 0.51), has a relatively low oxide concentration (O/GaAs=0.03 to 0.33) and is disordered (no LEED pattern).

A 300° C. anneal of a photoetched surface results in a stoichiometric surface (Ga/As=0.63 to 0.73) and an ordered surface (LEED pattern). It should be noted that an air exposed surface of the prior art would require a 600° C. anneal to achieve the same properties as a 300° C. anneal of a photoetched surface.

The intermediate product of the invention may also be employed to provide a constant and uniform arsenic vapor pressure, an illustration of which is provided in U.S. Pat. No. 4,472,206.

What has been described is a multi-element compound semiconductor intermediate product having a layer of the most volatile element on the surface and a photochemical technique for the production thereof.

Having thus described our invention, what we claim as new and desire to secure by Letters Patent is:

1. The method of providing intermediate processing passivation for a monocrystalline multielement compound semiconductor member comprising in combination the steps of:
   immersing said semiconductor member in a bath of 1:1 HCl:$H_2O$ while illuminating said multielement semiconductor member for a duration of from 10–30 minutes with a light having a photon energy greater than the energy gap width of said semiconductor at a power density of greater than 0.01 watts/cm$^2$.

2. The method of claim 1 wherein said semiconductor is a member of a group of GaAs, InAs, GaInAs and GaAlAs.

3. The method of claim 2 wherein said semiconductor is GaAs and said power density is in the range of 0.01 to 0.5 watts/cm$^2$.

4. The method of formation of a passivation layer on a device receiving surface of a multielement compound semiconductor crystal comprising the step of
etching said crystal in dilute HCl under illumination of light with a photon energy greater than the energy gap width of said crystal at a power density greater than 0.01 watts per cm$^2$ for a duration of 10 to 20 minutes.

5. The method of claim 4 wherein said crystal is a member of a group of GaAs, InAs, GaInAs and GaAlAs.

6. The method of claim 5 wherein said crystal is GaAs and said power density is in the range from 0.01 to 0.5 watts per cm$^2$.

* * * * *